(12) United States Patent
Norman

(10) Patent No.: US 9,030,889 B2
(45) Date of Patent: *May 12, 2015

(54) BUFFERING SYSTEMS FOR ACCESSING MULTIPLE LAYERS OF MEMORY IN INTEGRATED CIRCUITS

(71) Applicant: III Holdings 1, LLC, Wilmington, DE (US)

(72) Inventor: Robert Norman, Pendleton, OR (US)

(73) Assignee: III Holdings 1, LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/053,408

(22) Filed: Oct. 14, 2013

(65) Prior Publication Data

US 2014/0198584 A1 Jul. 17, 2014

Related U.S. Application Data

(63) Continuation of application No. 13/455,018, filed on Apr. 24, 2012, now Pat. No. 8,588,005, which is a continuation of application No. 13/191,232, filed on Jul. 26, 2011, now Pat. No. 8,164,960, which is a continuation of application No. 12/931,966, filed on Feb. 15, 2011, now Pat. No. 7,986,567, which is a continuation of application No. 12/008,212, filed on Jan. 9, 2009, now Pat. No. 7,889,571.

(51) Int. Cl.
*G11C 7/10* (2006.01)
*G11C 5/02* (2006.01)
*G11C 8/10* (2006.01)
(Continued)

(52) U.S. Cl.
CPC ............... *G11C 7/1078* (2013.01); *G11C 5/02* (2013.01); *G11C 7/1087* (2013.01); *G11C 7/1096* (2013.01); *G11C 8/10* (2013.01); *G11C 13/0033* (2013.01); *G11C 13/004* (2013.01); *G11C 13/0064* (2013.01); *G11C 13/0069* (2013.01); *G11C 16/10* (2013.01);
(Continued)

(58) Field of Classification Search
CPC .. G11C 7/1078; G11C 7/1096; G11C 13/004; G11C 13/0069; G11C 2213/71; G11C 7/1006; G11C 11/409
USPC ............. 365/189.05, 189.14–189.16, 185.33, 365/189.11, 230.06
See application file for complete search history.

(56) References Cited

U.S. PATENT DOCUMENTS 6,292,404 B1 * 9/2001 Tokuda ................... 365/189.05
6,853,590 B2 2/2005 Manning
(Continued)

OTHER PUBLICATIONS

Stolowitz Ford Cowger LLP Listing of Related Cases; Apr. 16, 2014; 1 page.

*Primary Examiner* — David Lam
(74) *Attorney, Agent, or Firm* — Stolowitz Ford Cowger LLP

(57) ABSTRACT

Embodiments of the invention relate generally to data storage and computer memory, and more particularly, to systems, integrated circuits and methods for accessing memory in multiple layers of memory implementing, for example, third dimension memory technology. In a specific embodiment, an integrated circuit is configured to implement write buffers to access multiple layers of memory. For example, the integrated circuit can include memory cells disposed in multiple layers of memory. In one embodiment, the memory cells can be third dimension memory cells. The integrated circuit can also include read buffers that can be sized differently than the write buffers. In at least one embodiment, write buffers can be sized as a function of a write cycle. Each layer of memory can include a plurality of two-terminal memory elements that retain stored data in the absence of power and store data as a plurality of conductivity profiles.

21 Claims, 9 Drawing Sheets

(51) Int. Cl.
  *G11C 13/00* (2006.01)
  *G11C 16/10* (2006.01)
(52) U.S. Cl.
  CPC ............. *G11C 2013/0085* (2013.01); *G11C 2013/0088* (2013.01); *G11C 2213/71* (2013.01); *G11C 2216/14* (2013.01)

(56) References Cited

U.S. PATENT DOCUMENTS

| | | | |
|---|---|---|---|
| 7,327,600 B2 | 2/2008 | Norman |
| 7,362,620 B2 | 4/2008 | Yano et al. |
| 7,573,753 B2 | 8/2009 | Atwood et al. |
| 7,593,284 B2 | 9/2009 | Norman |
| 7,649,788 B2 | 1/2010 | Norman |
| 7,652,501 B2 | 1/2010 | Norman |
| 7,652,502 B2 | 1/2010 | Norman |
| 7,715,250 B2 | 5/2010 | Norman |
| 7,813,210 B2 | 10/2010 | Norman |
| 7,822,913 B2 | 10/2010 | Norman |
| 7,877,541 B2 | 1/2011 | Norman |
| 7,889,571 B2 | 2/2011 | Norman |
| 7,986,567 B2 | 7/2011 | Norman |
| 8,020,132 B2 | 9/2011 | Norman |
| 8,164,960 B2 | 4/2012 | Norman |
| 8,588,005 B2 | 11/2013 | Norman |
| 2008/0005459 A1 | 1/2008 | Norman |
| 2008/0084727 A1 | 4/2008 | Norman |
| 2009/0164203 A1 | 6/2009 | Norman |
| 2009/0164744 A1 | 6/2009 | Norman |
| 2009/0172350 A1 | 7/2009 | Norman |
| 2009/0177833 A1 | 7/2009 | Norman |
| 2011/0141831 A1 | 6/2011 | Norman |
| 2011/0280060 A1 | 11/2011 | Norman |
| 2012/0206980 A1 | 8/2012 | Norman |

\* cited by examiner

BUFFERING SYSTEMS FOR ACCESSING MULTIPLE LAYERS OF MEMORY IN INTEGRATED CIRCUITS

CROSS-REFERENCE TO RELATED APPLICATIONS

This application is a continuation of U.S. patent application Ser. No. 13/455,018, filed Apr. 24, 2012, now U.S. Application Publication No. 2012/0206980, which is a continuation of U.S. patent application Ser. No. 13/191,232, filed Jul. 26, 2011, now U.S. Pat. No. 8,164,960, issued Apr. 24, 2012, which is a continuation of U.S. patent application Ser. No. 12/931,966, filed Feb. 15, 2011, now U.S. Pat. No. 7,986,567, issued Jul. 26, 2011, which is a continuation of U.S. patent application Ser. No. 12/008,212, filed Jan. 9, 2009, now U.S. Pat. No. 7,889,571, issued Feb. 15, 2011, each of which is incorporated herein by reference. This application incorporates herein by reference the following related application(s): U.S. patent application Ser. No. 11/095,026, filed Mar. 30, 2005, now U.S. Published Application No. 2006/0171200, and titled "Memory Using Mixed Valence Conductive Oxides," and U.S. patent application Ser. No. 12/001,952, filed Dec. 12, 2007, now U.S. Pat. No. 8,111,572, and titled "Disturb Control Circuits And Methods To Control Memory Disturbs Among Multiple Layers Of Memory".

FIELD OF THE INVENTION

Embodiments of the invention relate generally to data storage and computer memory, and more particularly, to systems, integrated circuits and methods to accessing memory cells in multiple layers of memory that implement, for example, third dimension memory cell technology.

BACKGROUND OF THE INVENTION

Conventional semiconductor memories typically use access buffers, such as a write buffer and a read buffer, for exchanging data between an interface and a memory array. Flash memory devices, for example, ordinarily use one buffer for writing to Flash memory cells and another buffer for reading therefrom. These buffers are usually sized to accommodate common addressable units of memory, such as a sector or a byte of data. In mass storage applications, Flash memory devices include NAND-type interfaces that serialize, at least in part, address and data onto a common bus. Further, Flash-based memories in mass storage applications typically use a state machine to manage executions of commands. While write and read buffers for conventional memories are functional, they have limitations. Some of these limitations are linked, at least to some degree, to the underlying semiconductor memory technology, such as Flash memory technology.

There are continuing efforts to improve technology for accessing memory.

BRIEF DESCRIPTION OF THE DRAWINGS

The present invention will be readily understood by the following detailed description in conjunction with the accompanying drawings. Like reference numerals refer to corresponding parts throughout the several views of the drawings. Note that most of the reference numerals include one or two left-most digits that generally identify the figure that first introduces that reference number. Although the Drawings depict various examples of the invention, the invention is not limited by the depicted examples. Furthermore, the depictions are not necessarily to scale.

DETAILED DESCRIPTION

Figure 1:
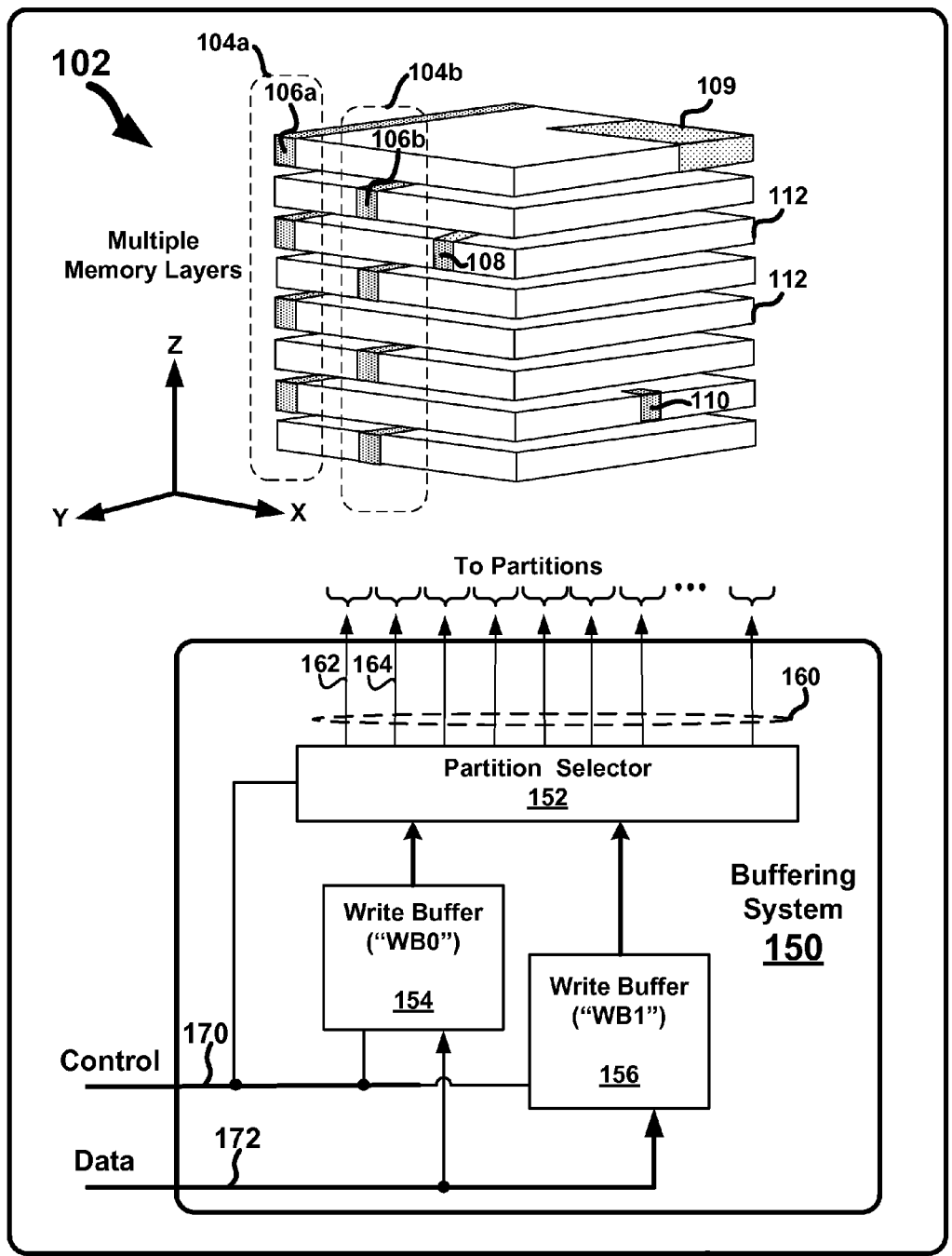
FIG. 1 illustrates an integrated circuit implementing a buffering system that is configured to access memory cells in multiple memory layers, according to at least one embodiment of the invention.

FIG. 1 depicts an integrated circuit 100 implementing a buffering system that is configured to access memory cells in multiple memory layers, according to at least one embodiment of the invention. Integrated circuit 100 includes a memory 102 and a buffering system 150. As shown, memory 102 includes multiple memory layers 112 formed on top of each other (e.g., in a Z dimension). Further, memory 102 is divided into partitions, such as grouping 104a and grouping 104b, each of which can be accessed (e.g., written) separately. Buffering system 150 includes a partition selector 152 and write buffers ("WB0") 154 and ("WB1") 156. Write buffers ("WB0") 154 and ("WB1") 156 can be sized to write to the partitions at a specific write speed. In at least one embodiment, the size of write buffers 154 and 156 can include any amount of data bits that are configured to adapt, for example, the write speed to an interface data rate. In some cases, the amount of data bits can differ from the smallest addressable unit of memory that constitutes a memory location. In another embodiment, the size of write buffers 154 and 156 can be configured to sufficiently write to memory cells in a partition as a function of a rate of change in a programming characteristic, such as a rate at which a write voltage changes. As such, the sizes of write buffers 154 and 156 can be configured to maintain a write speed for a specific rate at which, for example, a write voltage is applied to memory cells in multiple memory layers 112. The memory cells to which write buffers 154 and 156 write can be located in any plane within memory 102. As used herein, a "plane" refers, at least in one embodiment, to a flat, conceptual surface passing through, for example, the X and Y axes, the Y and Z axes, or the Z and X axes, as well as any similar surface that is parallel to any of the aforementioned axes. In a specific embodiment, the size of write buffers 154 and 156 can be sized differently than the sizes for one or more read buffers, which are not shown.

In view of the foregoing, integrated circuit 100 can implement a specific amount of data bits to be written per write cycle to reduce, for example, the peak power necessary to program the data bits without exceeding a peak power threshold. Thus, integrated circuit 100 can use smaller write drivers to reduce space or area that otherwise would be consumed to write larger amounts of data bits. Further, integrated circuit 100 can use an adjustable size for write buffers 154 and 156 for selecting a specific amount of data bits that are written per write cycle to provide for a write speed that is equivalent to, or is substantially equivalent to, an interface data rate, especially in implementations in which the rate at which a write voltage is applied to memory cells varies the programming time for memory cells in a write cycle. Between interface data rates and write speeds to memory, it is the latter that usually can determine an interface data rate. By sizing write buffers 154 and 156 appropriately, integrated circuit 100 can effectively set and maintain write speeds independent from modifications in the rate at which a write voltage is applied to memory cells, which, in turn, increases the time to complete a write cycle.

In some embodiments, integrated circuit 100 can vary the rate at which a write voltage is applied to reduce instantaneous changes in current and/or voltage, thereby reducing the "disturb effects," for example, between memory cells located in, for example, different planes of multiple layers 112 of memory 102. Further, integrated circuit 100 can also vary the rate at which a write voltage increases or decreases to reduce the magnitudes of overshoot voltages when programming memory cells in multiple layers 112 of memory 102, whereby each memory cell can store multiple states. Disturb effects generally refer to the effects, such as the electrical and/or electromagnetic coupling (or otherwise), on neighboring memory cells not selected for programming when other memory cells are written. So, integrated circuit 100 can reduce disturb effects by varying a programming characteristic, such as the write voltage. In at least embodiment, the size of partitions, such as partitions 106a and 106b, can be sized to reduce overall capacitance to increase access times to memory cells, and to further reduce disturb effects by, for example, reducing the amount of memory crossed by or adjacent to an active bit line. In one embodiment, the size of the partitions in memory 102 can be set to be equivalent to the sizes of write buffers 154 and 156. Note that the size of a partition can include any amount of memory cells and configured to be separately accessible for programming and/or reading. Examples of partitions include partitions 108, 109 and 110, as well as partitions 104a and 104b.

In at least one embodiment, the memory cells of memory 102 may be third dimension memory cells. A memory can be "third dimension memory" when it is fabricated above other circuitry components, the components usually including a silicon substrate, polysilicon layers and, typically, metallization layers. By using non-volatile third dimension memory arrays, memory systems can be vertically configured to reduce die size and while preserving overall functionality of an integrated circuit. In at least one instance, a third dimension cell can be a two-terminal memory element that changes conductivity as a function of a voltage differential between a first terminal and a second terminal. One example of third dimension memory is disclosed in U.S. patent application Ser. No. 11/095,026, filed Mar. 30, 2005, now U.S. Published Application No. 2006/0171200, and titled "Memory Using Mixed Valence Conductive Oxides," hereby incorporated by reference in its entirety and for all purposes, describes two-terminal memory cells that can be arranged in a cross-point array. The application describes a two-terminal memory element that changes conductivity when exposed to an appropriate voltage drop across the two terminals. The memory element includes an electrolytic tunnel barrier and a mixed valence conductive oxide. The voltage drop across the electrolytic tunnel barrier causes an electrical field within the mixed valence conductive oxide that is strong enough to move oxygen ions out of the mixed valence conductive oxides and into the electrolytic tunnel barrier. Oxygen depletion causes the mixed valence conductive oxide to change its valence, which causes a change in conductivity. Both the electrolytic tunnel barrier and the mixed valence conductive oxide do not need to operate in a silicon substrate, and, therefore, can be fabricated above circuitry being used for other purposes (such as selection circuitry). The two-terminal memory elements can be arranged in a cross-point array such that one terminal is electrically coupled with an x-direction line and the other terminal is electrically coupled with a y-direction line. A stacked cross-point array consists of multiple cross-point arrays vertically stacked upon one another, sometimes sharing x-direction and y-direction lines between layers, and sometimes having isolated lines. When a first write voltage $V_{W1}$ is applied across the memory element, (typically by applying $\frac{1}{2} V_{W1}$ to the x-direction line and $\frac{1}{2} -V_{W1}$ to the y-direction line) it switches to a low resistive state. When a second write voltage $V_{W2}$ is applied across the memory element, (typically by applying $\frac{1}{2} V_{W2}$ to the x-direction line and $\frac{1}{2} -V_{W2}$ to the y-direction line) it switches to a high resistive state. Typically, memory elements using electrolytic tunnel barriers and mixed valence conductive oxides require $V_{W1}$ to be opposite in polarity from $V_{W2}$.

Figure 5:
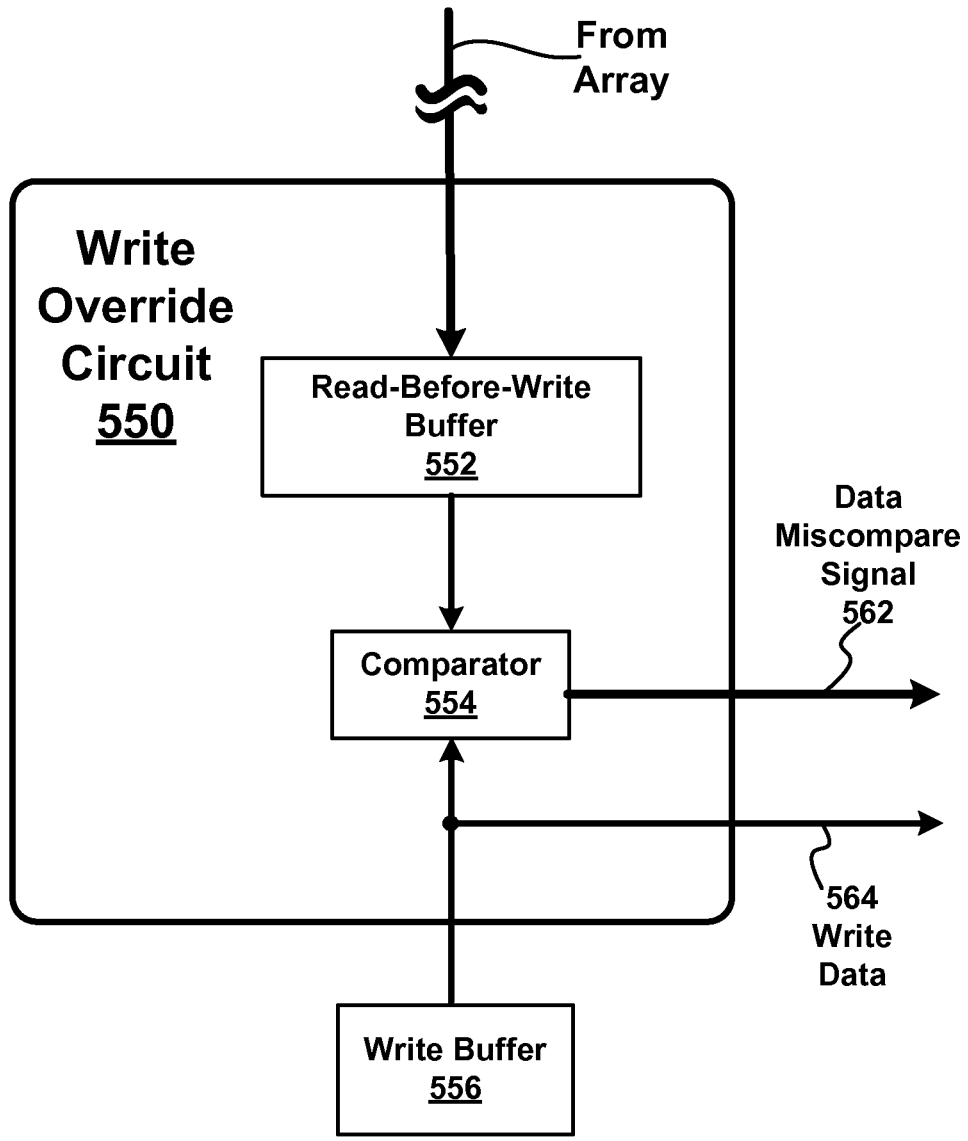
FIG. 5 is a block diagram depicting a write override circuit, according to an embodiment of the invention.
Figure 5A:
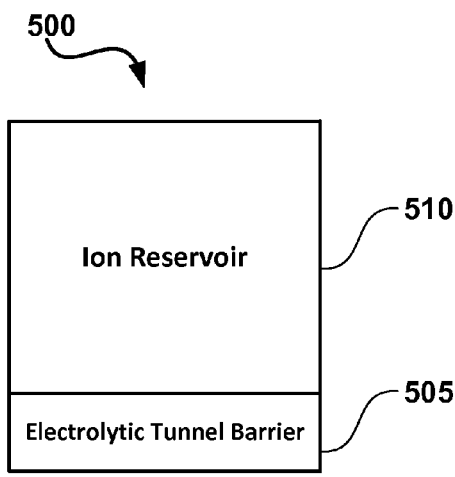
FIG. 5A depicts a block diagram representing the basic components of one embodiment of a memory element.
Figure 5B:
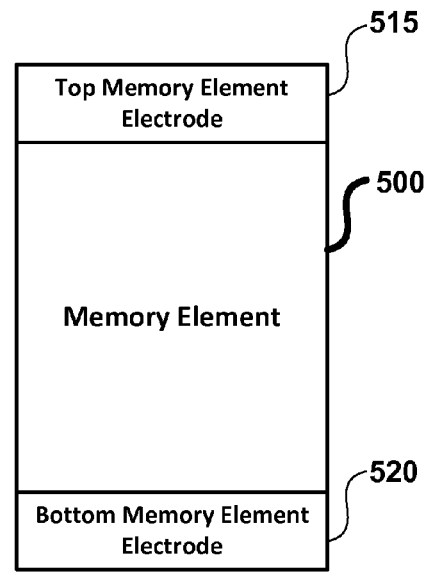
FIG. 5B depicts a block diagram of the memory element of FIG. 5A in a two-terminal memory cell.
Figure 5C:
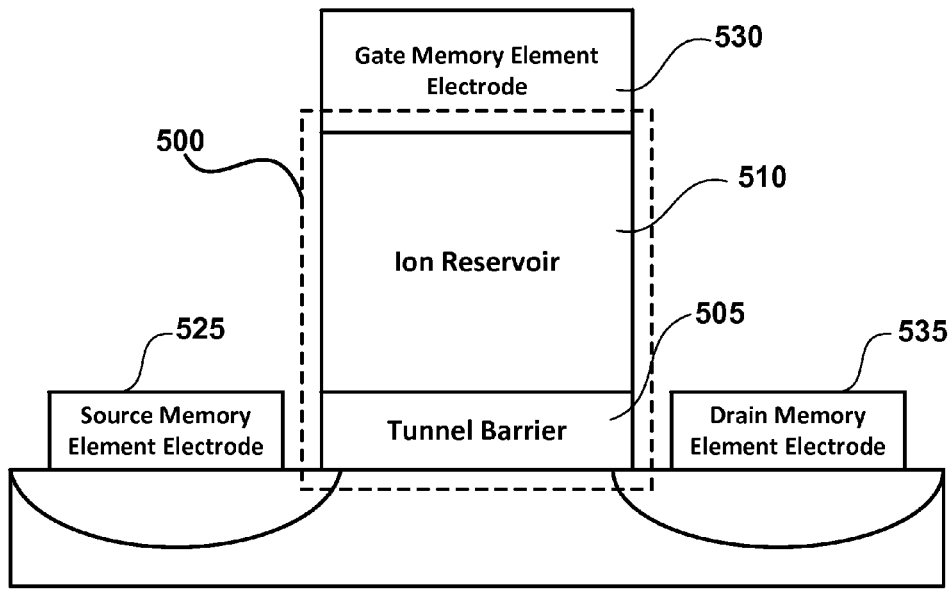
FIG. 5C depicts a block diagram of the memory element of FIG. 5A in a three-terminal memory cell.

Attention is now directed to FIGS. 5A-5C, where FIG. 5A shows an electrolytic tunnel barrier 505 and an ion reservoir 510, two basic components of the memory element 500. FIG. 5B shows the memory element 500 between a top memory electrode 515 and a bottom memory electrode 520. The orientation of the memory element (i.e., whether the electrolytic tunnel barrier 505 is near the top memory electrode 515 or the bottom memory electrode 520) may be important for processing considerations, including the necessity of seed layers and how the tunnel barrier reacts with the ion reservoir 510 during deposition. FIG. 5C shows the memory element 500 oriented with the electrolytic tunnel barrier 505 on the bottom in a three-terminal transistor device, having a source memory element electrode 525, gate memory element electrode 530 and a drain memory element electrode 535. In such an orientation, the electrolytic tunnel barrier 505 could also function as a gate oxide. Referring back to FIG. 5A, the electrolytic tunnel barrier 505 will typically be between 10 and less than 50 angstroms. If the electrolytic tunnel barrier 505 is much greater than 50 angstroms, then the voltage that is required to create the electric field necessary to move electrons through the memory element 500 via tunneling becomes too high for most electronic devices. Depending on the electrolytic tunnel barrier 505 material, a preferred electrolytic tunnel barrier 505 width might be between 15 and 40 angstroms for circuits where rapid access times (on the order of tens of nanoseconds, typically below 100 ns) in small dimension devices (on the order of hundreds of nanometers) are desired. Fundamentally, the electrolytic tunnel barrier 505 is an electronic insulator and an ionic electrolyte. As used herein, an electrolyte is any medium that provides an ion transport mechanism between positive and negative electrodes. Materials suitable for some embodiments include various metal oxides such as $Al_2O_3$, $Ta_2O_5$, $HfO_2$ and $ZrO_2$. Some oxides, such as zirconia might be partially or fully stabilized with other oxides, such as CaO, MgO, or $Y_2O_3$, or doped with materials such as scandium. The electrolytic tunnel barrier 505 will typically be of very high quality, being as uniform as possible to allow for predictability in the voltage required to obtain a current through the memory element 500. Although atomic layer deposition and plasma oxidation are examples of methods that can be used to create very high quality tunnel barriers, the parameters of a particular system will dictate its fabrication options. Although tunnel barriers can be obtained by allowing a reactive metal to simply come in contact with an ion reservoir 510, as described in PCT Patent Application No. PCT/US04/13836, filed May 3, 2004, already incorporated herein by reference, such barriers may be lacking in uniformity, which may be important in some embodiments. Accordingly, in a preferred embodiment of the invention the tunnel barrier does not significantly react with the ion reservoir 510 during fabrication. With standard designs, the electric field at the tunnel barrier 505 is typically high enough to promote tunneling at thicknesses between 10 and 50 angstroms. The electric field is typically higher than at other points in the memory element 500 because of the relatively high serial electronic resistance of the electrolytic tunnel barrier 505. The high electric field of the electrolytic tunnel barrier 505 also penetrates into the ion reservoir 510 at least one Debye length. The Debye length can be defined as the distance which a local electric field affects distribution of free charge carriers. At an appropriate polarity, the electric field within the ion reservoir 510 causes ions (which can be positively or negatively charged) to move from the ion reservoir 510 through the electrolytic tunnel barrier 505, which is an ionic electrolyte. The ion reservoir 510 is a material that is conductive enough to allow current to flow and has mobile ions. The ion reservoir 510 can be, for example, an oxygen reservoir with mobile oxygen ions. Oxygen ions are negative in charge, and will flow in the direction opposite of current. Each memory plug contains layers of materials that may be desirable for fabrication or functionality. For example, a non-ohmic characteristic that exhibit a very high resistance regime for a certain range of voltages ($V_{NO-}$ to $V_{NO+}$) and a very low resistance regime for voltages above and below that range might be desirable. In a cross point array, a non-ohmic characteristic could prevent leakage during reads and writes if half of both voltages were within the range of voltages $V_{NO-}$ to $V_{NO+}$. If each conductive array line carried ½ $V_W$, the current path would be the memory plug at the intersection of the two conductive array lines that each carried ½ $V_W$. The other memory plugs would exhibit such high resistances from the non-ohmic characteristic that current would not flow through the half-selected plugs.

Note that memory 102, which can also be referred to as a "memory array," in some embodiments, can be implemented using layers 112 of memory elements arranged in blocks or sub-blocks to store data. By utilizing third dimension memory, driving voltage requirements can be met by using multiple, smaller charge pumps in some cases. Further, multiple, simultaneous accesses of memory elements in a memory array can be performed. While various types and designs of charge pump circuits can be used, the implementation of multiple, smaller charge pumps in a third dimension memory allows for die size to be reduced while improving the capabilities of integrated circuit 100, such as faster access times for performing multiple, simultaneous programmable sequences.

Buffering system 150 is configured to implement control signals path 170 and data signals path 172. In operation, one control signal from control signals path 170 is configured to control partition selector 152 to select which one of partition lines 160 is to be written. Another control signal from control signals path 170 can configure write buffer 154 to write to multiple layers 112 of memory 102 (e.g., via a first subset 162 of partition lines), and can further configure write buffer 156 to load data for writing during the next write cycle (e.g., via data signal path 172). During the next write cycle, the roles of write buffers 154 and 156 switch. As such, control signals on control signals path 170 can configure write buffer 154 to write via a second subset 164 of partition lines. Write buffers 154 and 156 can be configured to write and load substantially in synchronicity during a write cycle. For example, buffering system 150 can load write buffer 154 at the same time (or at substantially the same time) buffering system 150 uses write buffer 156 to write to memory 102. Further, the sizes of write buffers 154 and 156 can be sized such that the time to load one write buffer is substantially the same as the time to write to memory cells from the other write buffer. In at least one instance, one write buffer is loaded with data from data signals path 172 at a write data interface data rate, while the write data is written from the other write buffer at a particular write speed.

As an example, consider that the write data interface data rate is eight bits per one unit of time, and a write cycle is about four units of time. Accordingly, at least one write buffer can be configured to include thirty-two bits for writing four groups of eight-bit data. As used herein, the term "interface data rate" generally refers, at least in some embodiments, to the rate at which an amount of data bits (e.g., write data bits) are communicated per unit of time via a memory interface. As used herein, the term "write speed" generally refers, at least in some embodiments, to an amount of data bits written to memory cells (e.g., in a partition) per unit time, where such an amount can be an average number of data bits. In accord with the last example, consider that the write speed would be equivalent to 8 bits per unit time for a write buffer that can write 32 bits in one write cycle lasting four units of time. In one embodiment, the "write speed" can relate to a "programming time," which, at least in some cases, refers to the approximate amount of time required to program a memory cell. In at least one embodiment, a third dimension memory cell can be programmed in about 500 nanoseconds, or less. In at least one other embodiment, a third dimension memory cell can be programmed in about 50 nanoseconds, or less.

Figure 2A:
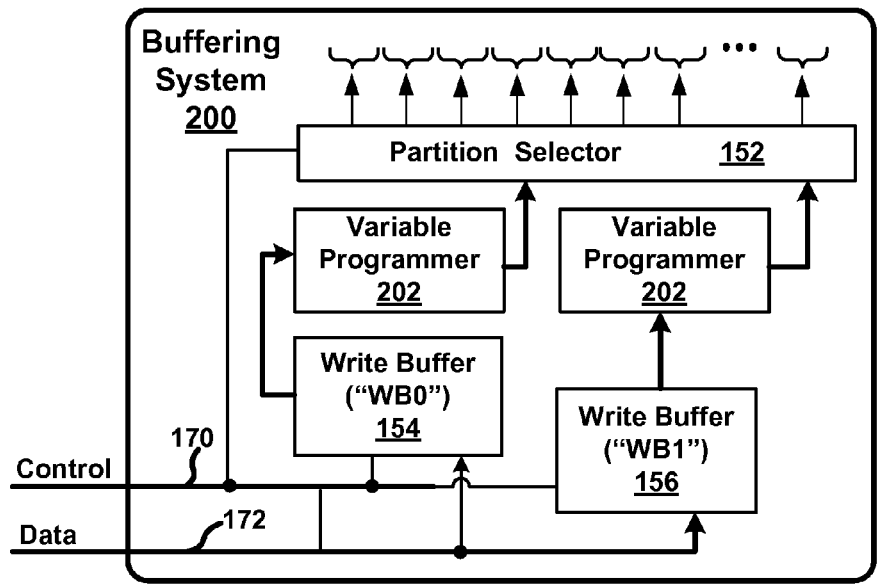
FIGS. 2A and 2D are diagrams detailing an implementation of a variable programmer for a buffering system, according to one embodiment of the invention.

FIG. 2A is a block diagram depicting an example of a buffering system 200 implementing a variable programmer, according to one embodiment of the invention. As shown, buffering system 200 can include elements described in FIG. 1, whereby similarly-named elements can have equivalent structures and/or functions as previously described. Further, buffering system 200 can also include one or more variable programmers 202 configured to vary a programming characteristic, such as a voltage, for programming memory cells in one or more partitions in multiple layers 112 of memory 102. In one embodiment, each variable programmer 202 can be configured to modify the states of third dimension memory cells in a partition using a write voltage having a slew rate. The states can include a logical one and a logical zero. Or, in some cases, the states can include multiple states, such as a logical "00," "01," "10," and "11," depending on the resistivity programmed into the third dimension memory cell. As used herein, the term "slew rate," at least in some embodiments, refers to the rate of change in a programming voltage over time. The slew rate can, in some cases, refer to an average rate of change in programming voltage. A third dimension cell can include a two-terminal memory element that changes conductivity as a function of a voltage differential between a first terminal and a second terminal. As such, each variable programmer 202 can be configured to generate a programming voltage for developing a voltage differential in accordance with the slew rate.

Figure 2B:
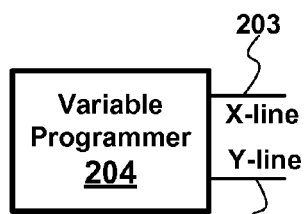

FIG. 2B is a block diagram depicting an example of a variable programmer 204 for generating programming voltages for third dimension cells, according to one embodiment of the invention. In this example, variable programmer 204 includes an X-line output 203 and a Y-line output 205 for providing, respectively, a voltage for an X-line (i.e., a row) and another voltage for a Y-line (i.e., a column). For example, the X-line output 203 and Y-line output 205 can generate either write voltages or read voltages, or both, for a third dimension memory array.

Figure 2C:
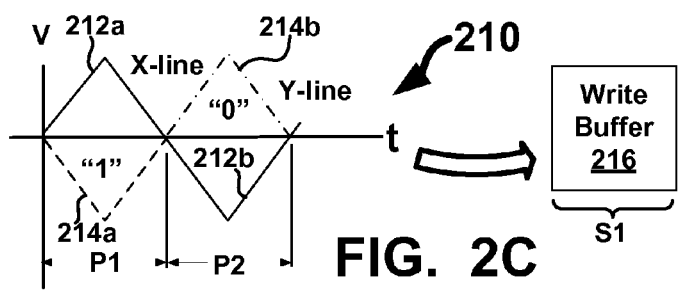

FIG. 2C is a diagram 210 depicting an example of programming voltages generated for third dimension cells, according to one embodiment of the invention. As shown, X-line output 203 of FIG. 2B provides a triangle-shaped write signal 212a having a positive voltage during a first phase, "P1," of a write cycle, and a triangle-shaped write signal 212b having a negative voltage during a second phase, "P2." By contrast, Y-line output 205 of FIG. 2B provides one triangle-shaped write signal during a write cycle. Accordingly, if a logical 1 is to be written into a memory cell, Y-line output 205 provides triangle-shaped write signal 214a having a negative voltage during a first phase, "P1," of a write cycle. No write signal would be produced in phase P2. But, if a logical 0 is to be written, Y-line output 205 provides triangle-shaped write signal 214b having a positive voltage during a second phase, "P2," of a write cycle subsequent to phase P1, during which a write voltage can be absent.

Figure 2D:
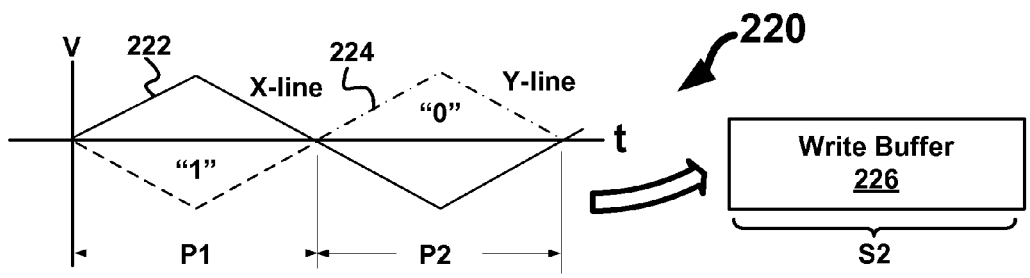

FIG. 2D is a diagram 220 showing another example of programming voltages generated for third dimension cells, according to one embodiment of the invention. As shown, X-line output 203 of FIG. 2B provides triangle-shaped write signal 222, and Y-line output 205 of FIG. 2B provides triangle-shaped write signal 224. But note that the phases P1 and P2, both of which constitute a write cycle, are longer in time in comparison to the phases in FIG. 2C. Further, triangle-shaped write signals 222 and 224 have a less steep slope (i.e., rate of change in voltage) as do the write signals shown in FIG. 2C. While a less steep slope may be preferable in certain applications, a longer write time is generally not preferable. As such, a write buffer 226 can be sized to size S2 for writing more data bits per write cycle, than, for example, write buffer 216 of FIG. 2C, which is sized at size S1. Note that while FIGS. 2C and 2D depict triangle waveforms, any kind of waveform, such as a sine waveform or a sawtooth waveform, can be used.

Figure 3A:
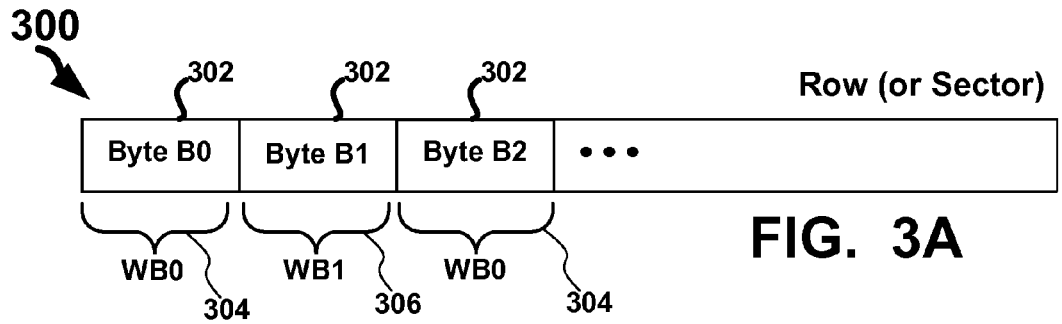
FIGS. 3A through 3D depict examples of the various size configurations for write buffers, according to various embodiments of the invention.
Figure 3B:
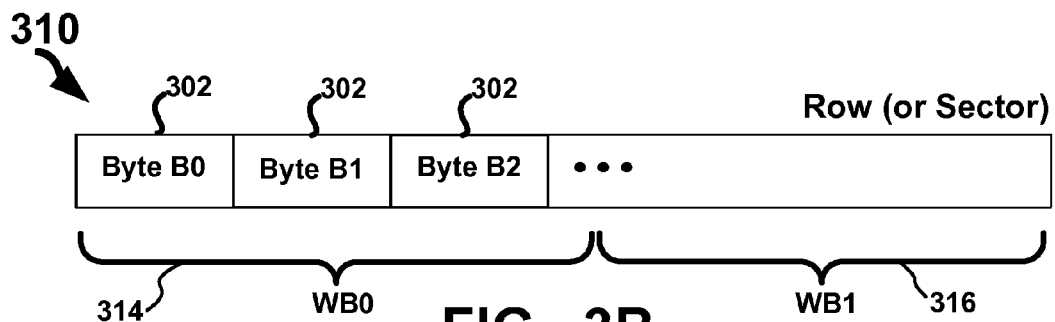

FIGS. 3A through 3D depict examples of the various size configurations for write buffers, according to various embodiments of the invention. FIG. 3A depicts a row 300 configured to store bytes 302 of data. In this example, write buffer ("WB0") 304 and write buffer ("WB1") 306 are each sized to write eight bits (i.e., a byte) per write cycle. In this case, each partition can be 8 bits wide. In other embodiments, row 300 is a sector including about 512 bytes. In cases in which row 300, as a sector, is the smallest packet of information that can be read or written (i.e., the smallest addressable unit of memory), write buffer 304 and write buffer 306 have sizes that differ from sector 300. FIG. 3B shows a row 310 configured to store bytes 302 of data. In this example, write buffer ("WB0") 314 and write buffer ("WB1") 316 are each sized to write half of the row size. So if row 310 represents a sector, then write buffer 314 and write buffer 316 each can write 256 bits (i.e., 32 bytes) per write cycle. In this case, each partition can be 256 bits wide. In other embodiments, write buffer 314 and write buffer 316 each can write 512 bytes (i.e., a sector) per write cycle.

Figure 3C:
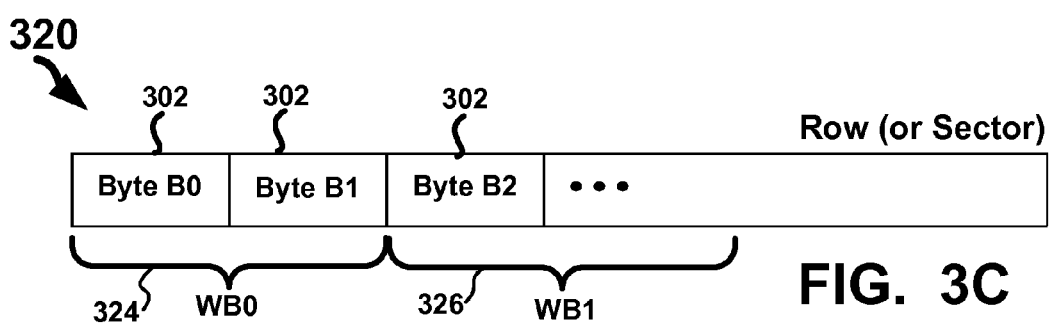
Figure 3D:
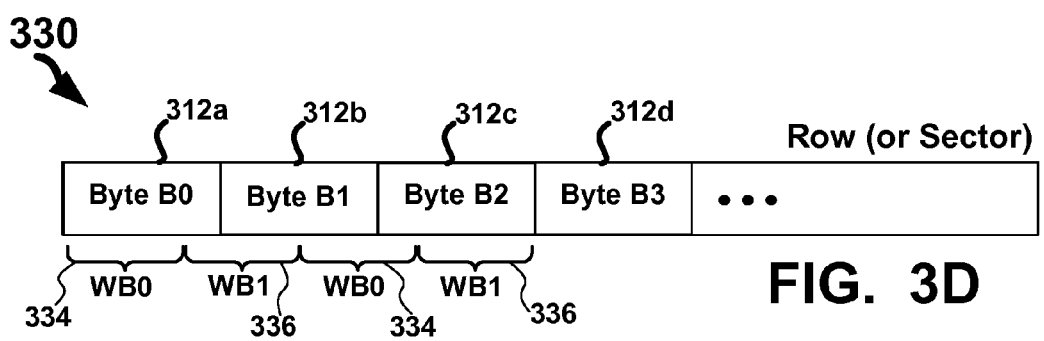

FIG. 3C depicts a row 320 configured to store bytes 302 of data in a row, whereby the smallest addressable unit is 8 bits. In this example, write buffer ("WB0") 324 and write buffer ("WB1") 326 are each sized to write multiples of eight bits (e.g., 2 or 4 bytes) per write cycle. FIG. 3D illustrates a row 330 configured to store bytes 302 of data in a row, whereby the smallest addressable unit is 8 bits. In this example, write buffer ("WB0") 334 and write buffer ("WB1") 326 are each sized to write less than eight bits per write cycle. For example, consider that write buffer 334 and write buffer 336 each can write six bits per write cycle. As such, write buffer 334 and write buffer 336 can write to three bytes, such as byte ("Byte B0") 312a, byte ("Byte B1") 312b, and byte ("Byte B2") 312c, over four write cycles. Thus, write buffer 334 and write buffer 336 each can be sized to include less bits than a byte, which is the smallest addressable unit of memory in this example. Accordingly, write buffers in FIGS. 3A through 3D can write any number of bits to facilitate matching the write speed to an interface data rate. As used herein, the term "smallest addressable unit" generally refers, at least in some embodiments, to the fewest number of bits that are accessible per memory location and/or address. Note that read buffers can be sized in a similar fashion, according to at least one embodiment of the invention. Note two that more than two write buffers are possible, and, further, multiple write buffers can be selected to write to memory while other multiple write buffers are selected to be loaded.

Figure 4:
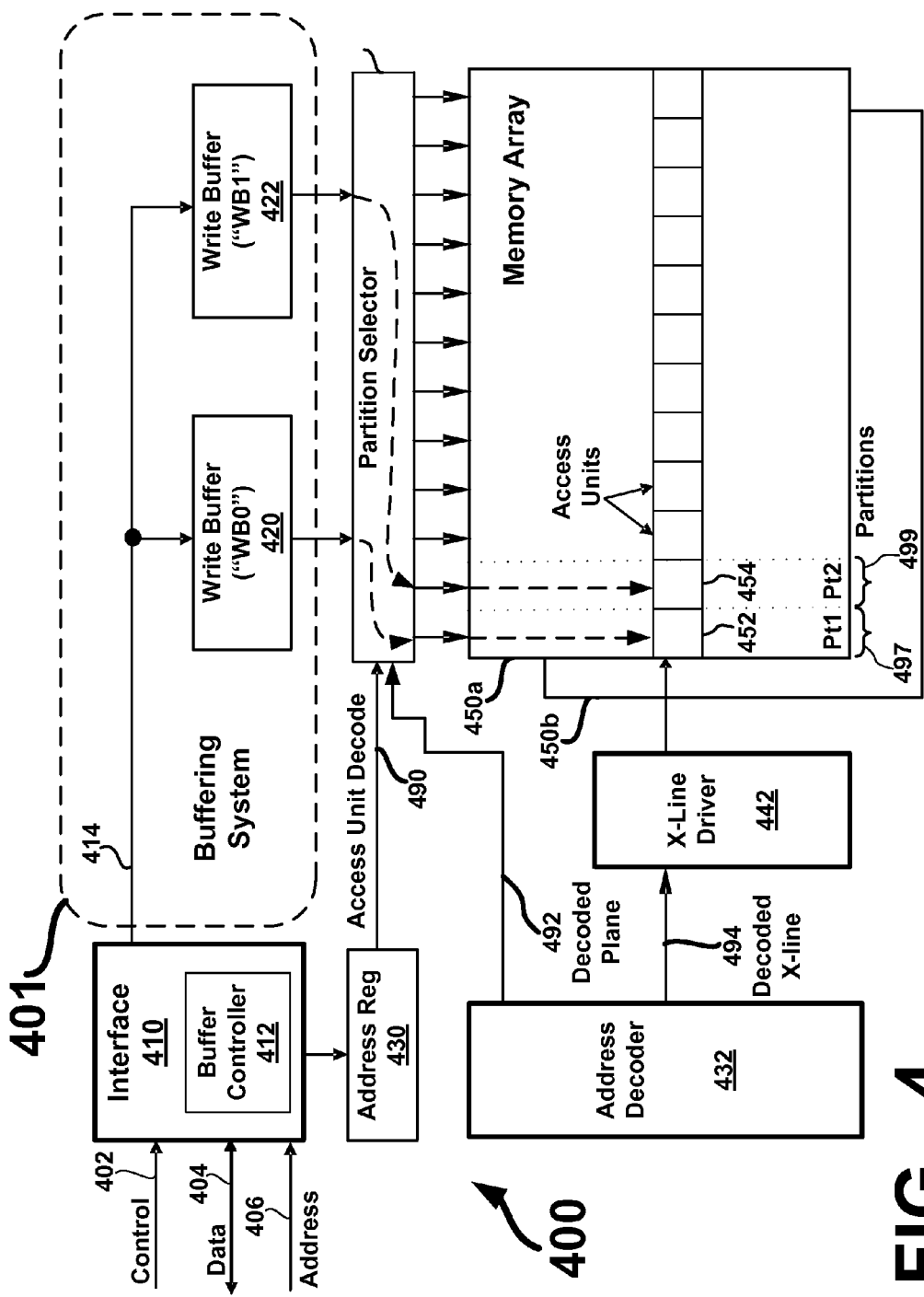
FIG. 4 is a block diagram showing an integrated circuit portion implementing a buffering system that includes write buffers, according to an embodiment of the invention.

FIG. 4 is a block diagram depicting an integrated circuit portion implementing a buffering system 401 that includes write buffers, according to an embodiment of the invention. In this example, an integrated circuit portion 400 includes an interface 410, multiple write buffers, such as write buffer 420 and write buffer 422, an address register ("Reg") 430, a partition selector 440, an address decoder 432, and X-line driver 442 and a layer 450a in multiple layers of memory array. Layer 450b is an example of another layer in the multiple layers of memory. Interface 410 includes ports to receive control signals 402 (e.g., a write enable signal, a chip select signal, etc.), address signals 406 and data signals 404 (e.g., write and/or read data signals). Interface 410 can be configured as either a NOR-type interface or a NAND-type interface. In embodiments in which interface 410 is a NAND-type interface, data signals 404 and address signals 406 are multiplexed onto a common I/O bus (not shown).

Interface 410 also includes a buffer controller 412 configured to load data into a first write buffer (e.g., write buffer 420), and to write data from a second write buffer (e.g., write buffer 422), whereby buffer controller 412 synchronizes the loading and writing within an interval or write cycle. In one embodiment, interface 410 and buffer controller 412 cooperate to provide interface control and data signals 414 to write buffer 420 and write buffer 422, whereby write data of interface control and data signals 414 is transmitted to the buffers in accordance with an interface data rate. Further, buffer controller 412 is configured to alternately configure write buffer 420 and write buffer 422 to respectively load data at the interface data rate and to write data at a write speed, which can be substantially the same as the interface data rate. In a specific embodiment, buffer controller 412 can include a counter set to count data bits until a number of the data bits that are loaded into one of the write buffers is equivalent to the size of the buffer. So when a particular write buffer is full, or is substantially full, buffer controller 412 switches the operation of the write buffers (e.g., from loading to writing, or vice versa).

During a write operation, an address to which data is being written is latched into address register 430. Address register 430 can generate a control signal for controlling partition selector 440. Further, address register 430 can manage writing data to specific access units, which can be equivalent to the smallest addressable unit of memory. Or, the access units can be larger or smaller. In various embodiments, an access unit can be the width (i.e., the same number of bits wide) as a partition. For example, access units 452 and 454 can reside in partition 1 ("Pt1") 497 and partition 2 ("Pt2") 499, respectively. Note that partitions 497 and 499 need not extend across the entire length of memory array 450a. In some embodiments, access units 452 and 454 each can constitute a partition. In at least one embodiment, buffer controller 412 is configured to, in whole or in part, convert write data received at a memory interface having an size to accommodate an interface, such as 8 bits wide, into access units that can be, for example, 6 bits wide. Buffer controller 412 can also do the same, but in a reverse manner, to convert read data received as access units from the array sized at, for example, 6 bits, into read data sized at 8 bits wide, for example, to match read data port width of the memory interface. Note that in some embodiments, access unit sizes and/or partition sizes for writing and reading can be different.

For example, if memory array 450a supported a mass storage application, then its smallest addressable unit of memory can be a sector. In addition, address register 430 can pass the address to address decoder 432. Further to this example, consider that write buffer 420 and write buffer 422 are each configured to write four bytes to access units having the same size. Address register 430 can cooperate with buffer controller 412 to coordinate the writing of each access unit until an entire sector is written. In one write cycle, address register 430 can control partition selector 440 to route write data from write buffer 420 to access unit 452, whereas in another write cycle, address register 430 can cause partition selector 440 to route write data from write buffer 422 to access unit 454. This continues until the sector is written. Similarly, address register 430 can cooperate with buffer controller 412 to coordinate the writing of each access unit in a memory that has the byte as the smallest addressable unit of memory. For example, access units 452 and 454 can be four bits wide. As such, access units 452 and 454 can constitute one byte, which can be an addressable as a memory location. Among other things, address decoder 432 decodes the address to select both a plane (or a layer) and an X-line associated with a row in memory array layer 450a. X-line driver 442 is configured to generate for a selected X-line a programming voltage signal and a read voltage signal during a write cycle and a read cycle, respectively. In at least one instance, write data is transmitted to the write buffers at a write data interface data rate, which is the interface data rate for write data. Note that a read data interface data rate is the interface data rate for read data, which can be the same as, or different from, the write data interface data rate. In some embodiments, there can be more than two write buffers.

FIG. 5 is a block diagram depicting a write override circuit 550, according to an embodiment of the invention. In this example, write override circuit 550 is configured to prevent applying a programming voltage to a memory cell, such as a third dimension memory cell, if the state of the data bit stored in the memory cell is the same as the data bit being written. This reduces stresses to the memory cell that otherwise might occur from continuously applying unnecessarily programming voltages. Thus, write override circuit 550 can enhance memory cell reliability, according to one embodiment. In one example, write override circuit 550 can include read-before-write buffer 552 and a comparator 554. Prior to writing data from a write buffer 556 to memory cells in multiple layers of memory, data from those memory cells are read from the array into read-before-write buffer 552. Comparator 554 determines whether one or more data bits have the same state. If the states are the same, comparator 554 does not generate a data miscompare signal 562. As such, write data 564 from write buffer 556 will not be written into the array. But if the states differ, then comparator 554 generates a data miscompare signal 562, which indicates that the new data to written is different than the currently-stored data. Thus, data miscompare signal 562 enables write data 564 to be written into the array.

Figure 6:
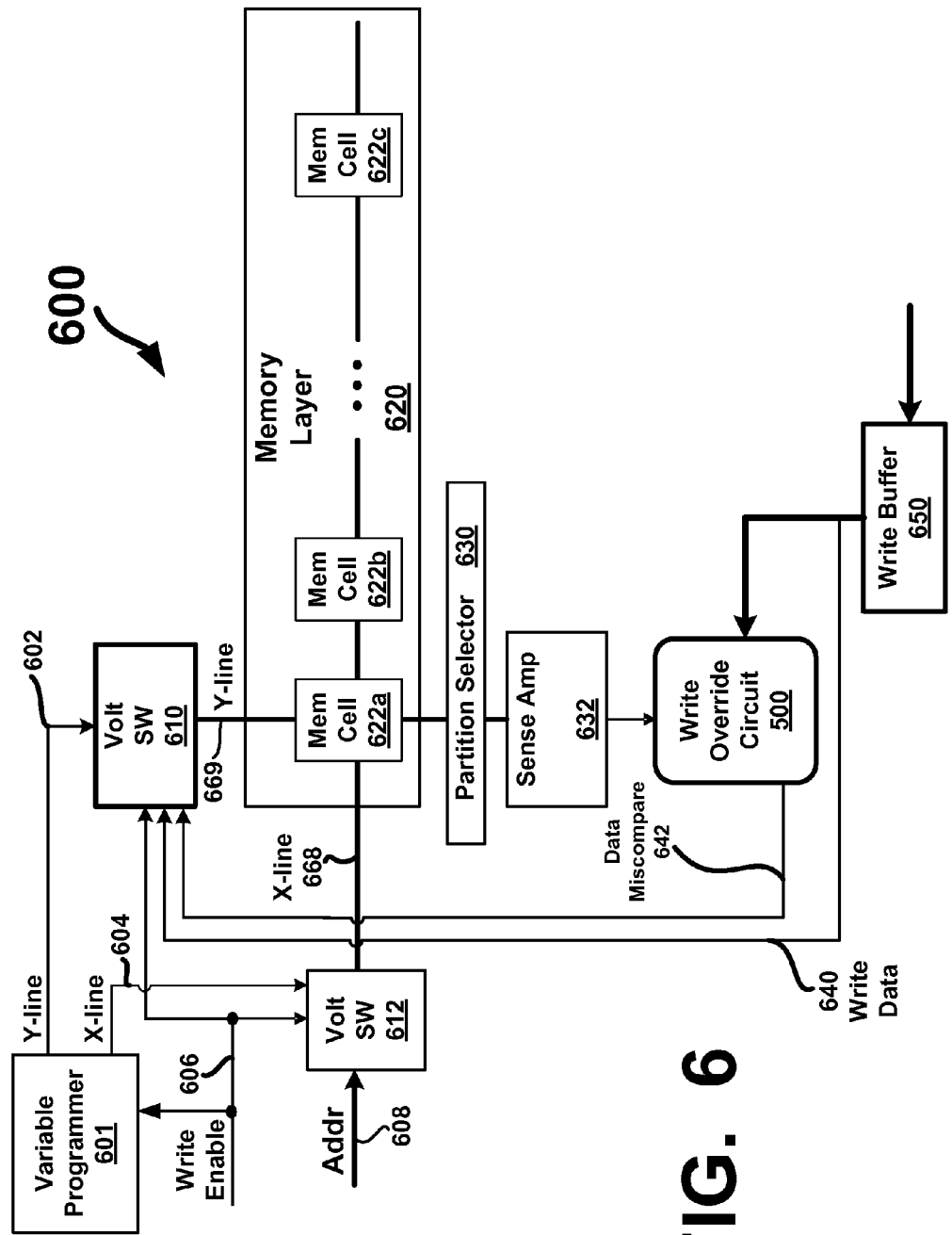
FIG. 6 is a block diagram depicting an example of an integrated circuit implementing a write override circuit, according to an embodiment of the invention.

FIG. 6 is a block diagram depicting an example of an integrated circuit implementing a write override circuit, according to an embodiment of the invention. In this example, an integrated circuit portion 600 includes a write override circuit 550, a variable programmer circuit 601, an X-line voltage switch ("Volt SW") 612, and a Y-line voltage switch ("Volt SW") 610. Integrated circuit portion 600 can also include one memory layer 620 in any of the multiple layers of memory, a Y-Line partition selector 630, and one or more sense amplifiers ("Sense Amp") 632. As shown, memory layer 620 includes any number of memory cells 622a, 622b, and 622c associated with an X-line 668. In operation, variable programmer circuit 601 is configured to generate a Y-line write voltage at Y-line output 602 and an X-line write voltage at X-line output 604, when write enable signal 606 is in a state that is indicative of a write operation. Otherwise, variable programmer circuit 601 is configured to generate a Y-line read voltage at Y-line output 602 and an X-line read voltage at X-line output 604. Write enable signal 606 can also control operation of X-line voltage switch 612 and Y-line voltage switch 610 for selecting a specific memory cell 622a or subset of memory cells (e.g., constituting an access unit, or number of bits programmed in a partition during a write cycle). X-line voltage switch 612, for example, selects X-line 668 in response to address ("Addr") 608.

In one embodiment, integrated circuit portion 600 implements write override circuit 550 in a two-phase process during a write cycle, whereby both phases can occur in parallel or in series. First, integrated circuit portion 600 detects a write to an access unit including memory cell 622a. In response, write buffer 650 communicates write data 640 to write override circuit 550 and to Y-line voltage switch 610. Second, variable programmer circuit 601 generates an X-line read voltage at X-line output 604, which cause memory cell 622a to read out a state stored therein. Memory cell 622a communicates the state down Y-line 666 to write override circuit 500. If the states are the same, write override circuit 550 does not generate a data miscompare signal 642, thereby disabling Y-line voltage switch 610, which, in turn, blocks a Y-line write voltage at Y-line output 602 from accessing memory cell 622a. As such, write data 640 from write buffer 650 will not be written into array 620. This prevents subjecting memory cell 622a to an unnecessary write voltage, thereby enhancing that cell's reliability. But if the states differ, then write override circuit 550 generates data miscompare signal 642, which indicates that the new data to written is different than the currently-stored data. Thus, data miscompare signal 642 enables Y-line voltage switch 610 to propagate the Y-line write voltage at Y-line output 602 to memory cell 622a so that write data 640 (or a portion thereof) can be written into array 620.

Figure 7:
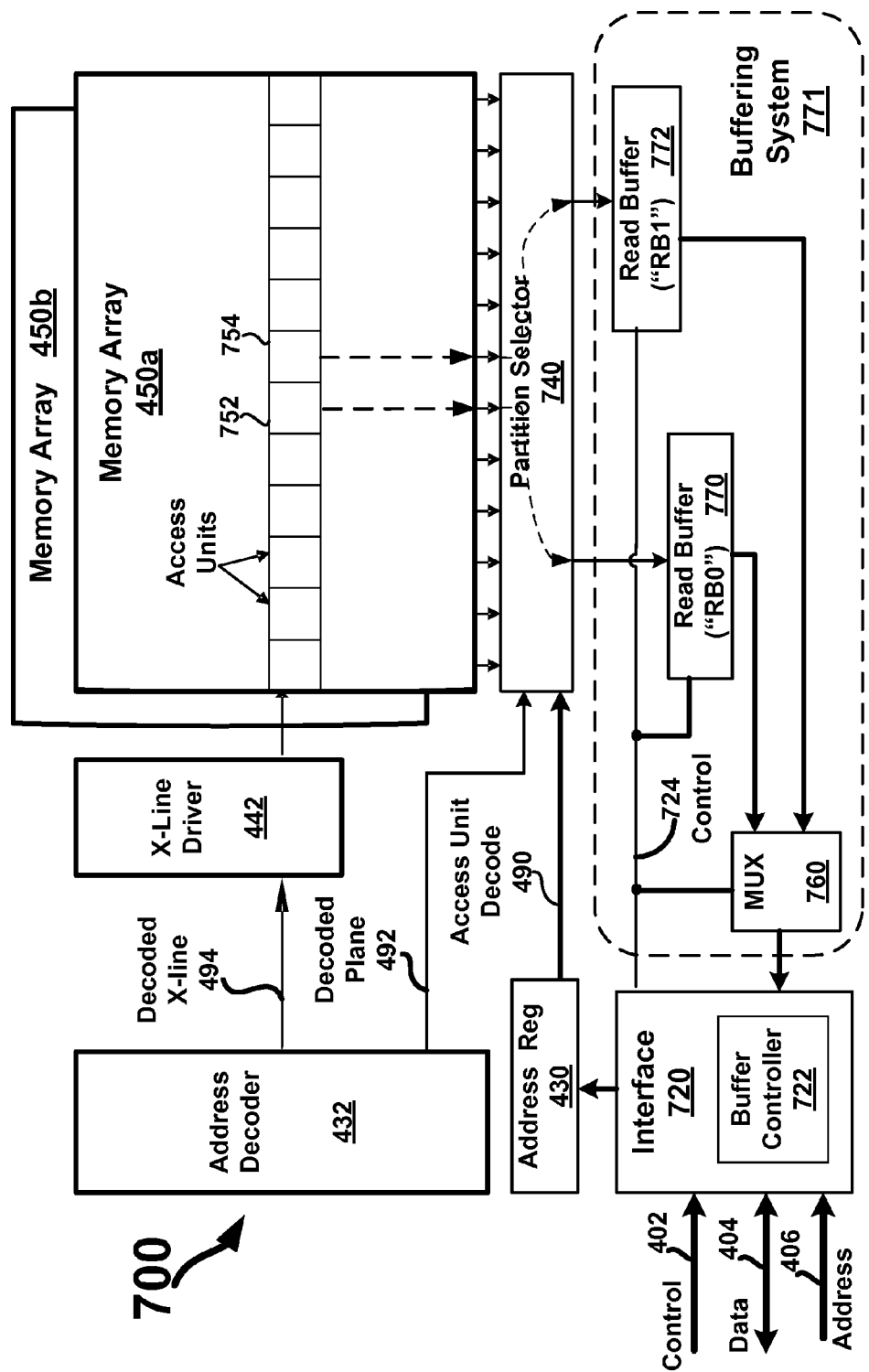
FIG. 7 is a block diagram showing an integrated circuit portion implementing a buffering system that includes read buffers, according to an embodiment of the invention.

FIG. 7 is a block diagram depicting an integrated circuit portion implementing a buffering system 771 that includes read buffers, according to an embodiment of the invention. In this example, an integrated circuit portion 700 includes an interface 720, buffering system 771 using multiple read buffers, such as read buffer 770 and read buffer 772, an address register ("Reg") 430, a partition selector 740, an address decoder 432, and X-line driver 442 and a layer 450a in multiple layers of memory array. Interface 720 includes ports to receive control signals 402 (e.g., a write enable signal, a chip select signal, etc.), address signals 406 and data signals 404 (e.g., read data embodied in read data signals). Integrated circuit portion 700 can include elements described in FIG. 4, whereby similarly-named elements have equivalent structures and/or functions as previously described. Note that interface 720 can be configured as either a NOR-type interface or a NAND-type interface. In embodiments in which interface 720 is a NAND-type interface, address signals 406 and data signals 404 are multiplexed onto a common I/O bus (not shown).

Interface 720 also includes a buffer controller 722 configured to control the reading of data into a first write buffer (e.g., read buffer 770), and the transmitting of data from a second write buffer (e.g., read buffer 772), whereby buffer controller 712 synchronizes the reading and transmitting to a certain interval or read cycle. As used herein, the term "read cycle" generally refers, at least in one embodiment, to an amount of time during which a read buffer is filled, or substantially filled, with read data from layer 450a, the read data being read out from at a particular read speed. As used herein, the term "read speed" generally refers, at least in one embodiment, to the rate at which one or more data bits are read from memory cells, such as third dimension memory cells. In one embodiment, interface 720 and buffer control 712 cooperate to provide interface control 724 to read buffer 770 and read buffer 772 to alternately configure read buffer 770 and read buffer 772 to, for example, respectively read data from layer 450a at a read speed and to transmit the read data at a read data interface data rate. In one read cycle, read buffer 770 can read the data from access unit 752, whereas in another read cycle, buffer 772 can read the data from access unit 754. The read data continues being read out via multiplexer ("MUX") 760 and interface 720 to an external terminal (not shown), such as an I/O pin, as read data in data signals 404. In at least one embodiment, buffer controller 722 can include a counter set to count data bits until a number of the data bits that is read into one of the read buffers is equivalent to the size of the read buffer. So when a particular read buffer is full, or is substantially full, buffer controller 722 switches the operation of the read buffers (e.g., from read to transmitting, or vice versa). Note that buffer controller 722 can control via multiplexer 760 which of read buffers 770 and 772 will be selected to provide read data.

Note that in some embodiments, the sizes of read buffers 770 and 772 can be determined as a function of a read voltage. As read speeds and/or voltages for memory cells, such as third dimension memory cells, can be less than write speeds and/or voltages for the same cells, then a read cycle can be less than a write cycle. Accordingly, the size of read buffers 770 and 772 can be different than the size of write buffers. In at least one embodiment, the size of read buffers 770 and 772 can be the same size as the write buffers. In some embodiments, there can be more than two read buffers.

Figure 8:
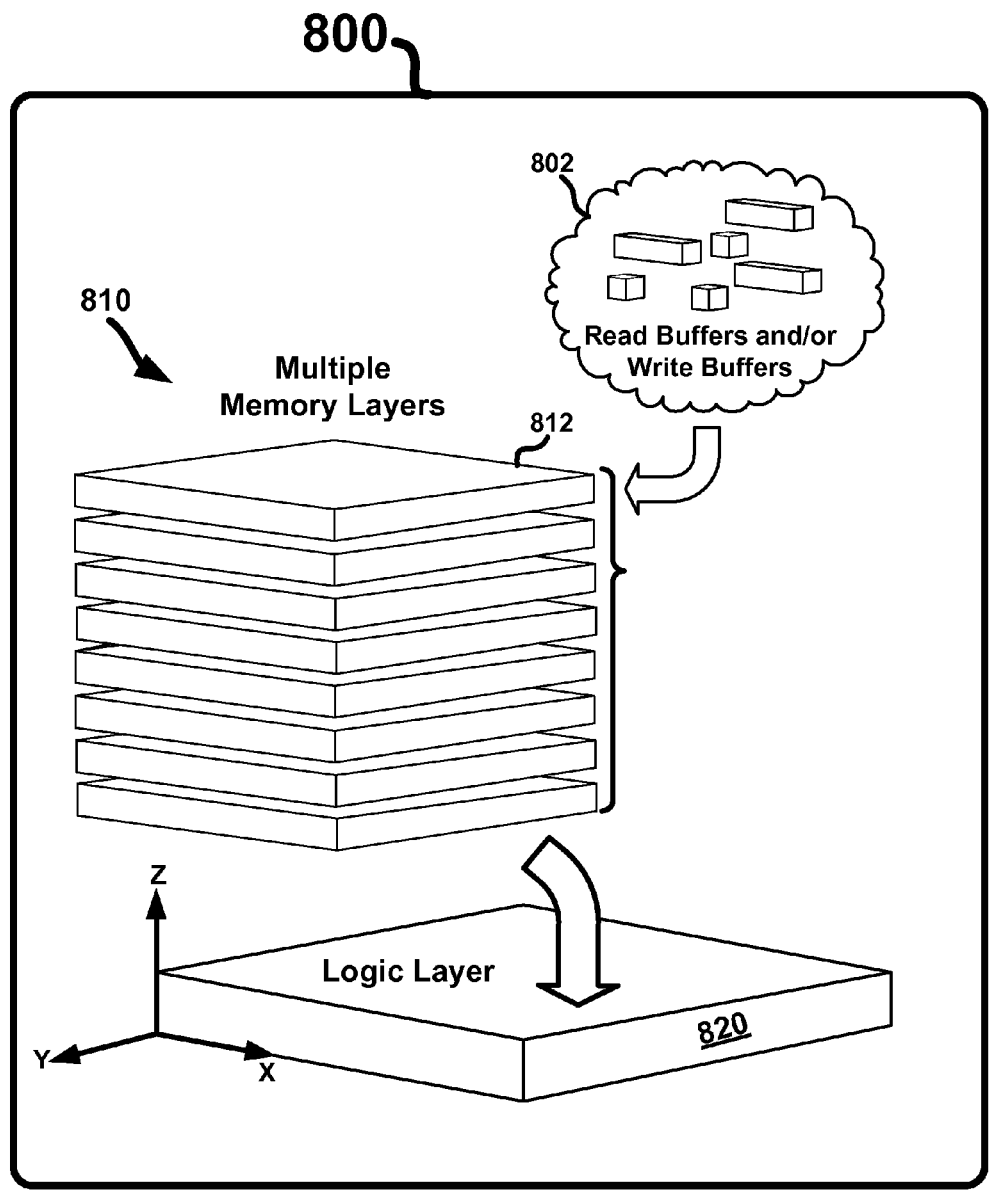
FIG. 8 illustrates an integrated circuit implementing a buffering system that includes buffers that are disposed in multiple layers of memory, according to at least one embodiment of the invention.

FIG. 8 depicts an integrated circuit 800 implementing a buffering system composed of buffers disposed in multiple layers of memory, according to at least one embodiment of the invention. Integrated circuit 800 includes a memory 810 including multiple layers 812 of memory. As shown, multiple layers 812 of memory can include access buffers 802 for a buffering system. Access buffers 802 can include write buffers and/or read buffers. As shown, memory 810 includes multiple memory layers 812 formed on top of each other (e.g., in the Z dimension), which, in turn, is formed on a logic layer 820, which can include logic, such as a buffer controller (or a portion thereof) for a buffering system. In view of the foregoing, a designer can add write and read buffers as access buffers 802 in memory 810 without increasing the die size of, for example, logic layer 820 or the substrate (not shown) upon which logic layer 820 is formed. Specifically, adding write and read buffers as access buffers 802 in multiple layers 812 predominantly affects the Z dimension of integrated circuit 800 rather than the X and Y dimensions. As such, implementation of write and read buffers facilitate buffering write and read data without increasing the die size to include write and read buffers in logic layer 820 or on the substrate.

Further, third dimension memory cells in memory 810 can be produced with equivalent fabrication processes that produce logic layer 820. As such, both can be manufactured in the same or different fabrication plants, or "fabs," to form integrated circuit 800 on a single substrate. This enables a manufacturer to first fabricate logic layer 820 using a CMOS process in a first fab, and then port logic layer 820 to a second fab at which additional CMOS processing can be used to fabricate multiple memory layers 812 directly on top of logic layer 820. Note that memory 810 can be vertically stacked on top of logic layer 820 without an intervening substrate. In at least one embodiment, multiple memory layers 812 are fabricated to arrange the third dimension memory cells in a stacked cross point array. In particular, two-terminal memory elements can be arranged in a cross point array such that one terminal is electrically coupled with an X-direction line and the other terminal is electrically coupled with a Y-direction line. A stacked cross point array includes multiple cross point arrays stacked upon one another, sometimes sharing X-direction and Y-direction lines between layers 812, and sometimes having isolated lines. Both single-layer cross point arrays and stacked cross point arrays may be arranged as third dimension memories.

Embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes may be performed in an arbitrary order, unless otherwise provided in the claims.

The foregoing description, for purposes of explanation, used specific nomenclature to provide a thorough understanding of the various embodiments of the invention. However, it will be apparent to one skilled in the art that specific details are not required in order to practice embodiments of the invention. In fact, this description should not be read to limit any feature or aspect of the present invention to any embodiment; rather features and aspects of one embodiment can readily be interchanged with other embodiments.

Thus, the foregoing descriptions of specific embodiments of the invention are presented for purposes of illustration and description. They are not intended to be exhaustive or to limit the invention to the precise forms disclosed; many alternatives, modifications, equivalents, and variations are possible in view of the above teachings. For the purpose of clarity, technical material that is known in the technical fields related to the embodiments has not been described in detail to avoid unnecessarily obscuring the description. Thus, the various embodiments can be modified within the scope and equivalents of the appended claims.

Further, the embodiments were chosen and described in order to best explain the principles of the invention and its practical applications; they thereby enable others skilled in the art to best utilize the various embodiments with various modifications as are suited to the particular use contemplated. Notably, not every benefit described herein need be realized by each embodiment of the present invention; rather any specific embodiment can provide one or more of the advantages related to the various embodiments of the invention. In the claims, elements and/or operations do not imply any particular order of operation, unless explicitly stated in the claims. It is intended that the following claims and their equivalents define the scope of the invention.

What is claimed is:

1. An apparatus, comprising:
   means for alternating selection of a first write buffer to load and a second write buffer to write a first number of bits during a write cycle; and
   means for decoding an address to access a number of third-dimension memory cells to determine whether to write the first number of bits, wherein the number of third-dimension memory cells reside in at least one layer of multiple layers of the third-dimension memory cells.

2. The apparatus of claim 1, further comprising:
   means for alternating selection of a first read buffer and a second read buffer to read a second number of bits during a read cycle.

3. The apparatus of claim 1, further comprising:
   means for writing the first number of bits into the number of third-dimension memory cells using a programming voltage having a slew rate over at least a portion of the write cycle;
   wherein a size of the first write buffer corresponds to the first number of bits.

4. The apparatus of claim 3, wherein a size of the second write buffer corresponds to the first number of bits.

5. An apparatus, comprising:
   means for determining a size configuration for a plurality of write buffers as a function of a slew rate for a programming voltage; and
   means for configuring a buffer controller to write to a layer constituting one of multiple layers of a memory from a first subset of the write buffers and to load a second subset of the write buffers, wherein writing data from the first subset at least partially overlaps an interval in which the second subset is loaded.

6. The apparatus of claim 5, further comprising:
   means for detecting a write of a state to a memory cell storing the same state; and
   means for preventing the write of the state to the memory cell.

7. The apparatus of claim 5, further comprising:
   means for configuring a write operation to include a read operation for a location in the memory;
   means for comparing write data for the write operation to read data for the read operation; and
   means for determining whether to disable the write operation to the location in response to a result of the comparison.

8. An apparatus, comprising:
   a buffer controller configured to alternate selection of a first write buffer for loading and a second write buffer for writing a first number of bits during a write cycle; and
   an address decoder configured to decode an address for accessing a number of third-dimension memory cells to determine whether to write the first number of bits, wherein the number of third-dimension memory cells reside in at least one layer of multiple layers of the third-dimension memory cells.

9. The apparatus of claim 8, wherein the buffer controller is further configured to alternate selection of a first read buffer and a second read buffer to read a second number of bits during a read cycle.

10. The apparatus of claim 8, wherein the address decoder is further configured to:
    determine the at least one layer of multiple layers from at least a portion of the address; and
    transmit the first number of bits in a direction orthogonal to the at least one layer of the multiple layers.

11. The apparatus of claim 8, wherein the first number of bits is different than the second number of bits.

12. The apparatus of claim 8, wherein the buffer controller is further configured to load a number of bits into the first write buffer at a write data interface data rate that corresponds to a write speed at which the first number of bits is written.

13. The apparatus of claim 8, further comprising:
    a programmer configured to write the first number of bits into the number of third-dimension memory cells using a programming voltage having a slew rate over at least a portion of the write cycle;
    wherein a size of the first write buffer corresponds to the first number of bits.

14. The apparatus of claim 13, wherein a size of the second write buffer corresponds to the first number of bits.

15. An apparatus, comprising:
    a processing device configured to:
    determine a size configuration for a plurality of write buffers as a function of a slew rate for a programming voltage; and
    write to a layer constituting one of multiple layers of a memory from a first subset of the write buffers and load a second subset of the write buffers, wherein writing data from the first subset at least partially overlaps an interval in which the second subset is loaded.

16. The apparatus of claim 15, wherein the processing device is further configured to select the slew rate for writing to a plurality of third-dimension memory cells disposed in the layer.

17. The apparatus of claim 15, wherein the processing device is further configured to select the size configuration as a multiple of an amount of data bits being loaded at an interface data rate.

18. The apparatus of claim 15, wherein the processing device is further configured to select a size configuration for a plurality of read buffers as a function of a read voltage.

19. The apparatus of claim 15, wherein the processing device is further configured to:
    detect a write of a state to a memory cell storing the same state; and
    prevent the write of the state to the memory cell.

20. The apparatus of claim 19, wherein the processing device is further configured to read a stored state in the memory cell, compare the stored state to the state associated with the write, and disable the write if there is a match between the stored state and the state associated with the write.

21. The apparatus of claim 15, wherein the processing device is further configured to:

compare write data for a write operation for a location in the memory to read data for a read operation that corresponds to the write operation; and determine whether to disable the write operation to the location in response to a result of the comparison.

* * * * *